US012253545B2

(12) United States Patent
Roy et al.

(10) Patent No.: US 12,253,545 B2
(45) Date of Patent: Mar. 18, 2025

(54) HIGH ACCURACY NON-INVASIVE CURRENT SENSOR SYSTEM

(71) Applicant: Purdue Research Foundation, West Lafayette, IN (US)

(72) Inventors: Kaushik Roy, West Lafayette, IN (US); Byunghoo Jung, West Lafayette, IN (US); Chamika Mihiranga Liyanagedera, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 421 days.

(21) Appl. No.: 17/779,480

(22) PCT Filed: Nov. 24, 2020

(86) PCT No.: PCT/US2020/062067
§ 371 (c)(1),
(2) Date: May 24, 2022

(87) PCT Pub. No.: WO2021/102446
PCT Pub. Date: May 27, 2021

(65) Prior Publication Data
US 2023/0030682 A1 Feb. 2, 2023

Related U.S. Application Data

(60) Provisional application No. 62/967,404, filed on Jan. 29, 2020, provisional application No. 62/939,677, filed on Nov. 24, 2019.

(51) Int. Cl.
*G01R 15/20* (2006.01)
*G01R 19/14* (2006.01)
*G01R 25/00* (2006.01)

(52) U.S. Cl.
CPC .......... *G01R 15/205* (2013.01); *G01R 19/14* (2013.01); *G01R 25/00* (2013.01)

(58) Field of Classification Search
CPC ...... G01R 15/205; G01R 19/14; G01R 25/00; G01R 19/0053; G01R 19/0015; G01R 15/207; G01R 23/165; H10N 50/10
See application file for complete search history.

(56) References Cited

U.S. PATENT DOCUMENTS 4,158,808 A   6/1979  Massa et al.
6,820,017 B1  11/2004 Jurisch et al.
(Continued)

FOREIGN PATENT DOCUMENTS

WO   2018102830   6/2018

OTHER PUBLICATIONS

International Search Report and Written Opinion for International Application No. PCT/US2020/062067, dated Feb. 12, 2021, 13 pages.

*Primary Examiner* — Jermele M Hollington
*Assistant Examiner* — Zannatul Ferdous
(74) *Attorney, Agent, or Firm* — Hartman Global IP Law; Gary M. Hartman; Domenica N. S. Hartman

(57) ABSTRACT

System and methods for high accuracy, non-intrusive current sensing are provided. A system may include two magnetic field sensors configured for differential sensing. The system may further include frontend circuitry configured to remove direct current (DC) offset of the magnetic field sensors, upconvert the outputs of the magnetic field sensors, and filter out at least one frequency component from the up-converted signals. The system may receive output signals from the front-end circuitry corresponding to each sensor. The system may further calculate a differential signal based on the output signals. The system may apply optimal detec-
(Continued)

tion based on the differential signal and a reference signal to calculate a measurement of current flow. The system may determine a phase angle measurement between the differential signal and the reference signal to calculate a direction of the current flow in the conductor and output various measurement information related to the detected current.

17 Claims, 8 Drawing Sheets

(56) References Cited

U.S. PATENT DOCUMENTS

| | | | |
|---|---|---|---|
| 9,322,850 B2* | 4/2016 | Wood | G01R 15/04 |
| 9,488,700 B2* | 11/2016 | Motz | G01R 33/095 |
| 9,841,485 B2* | 12/2017 | Petrie | G01D 5/2448 |
| 2013/0265041 A1 | 10/2013 | Friedrich et al. | |
| 2014/0285206 A1 | 9/2014 | West et al. | |
| 2015/0331072 A1 | 11/2015 | Ogawa et al. | |
| 2017/0222490 A1 | 8/2017 | Boys et al. | |
| 2020/0057120 A1* | 2/2020 | Belin | G01R 33/096 |

\* cited by examiner

HIGH ACCURACY NON-INVASIVE CURRENT SENSOR SYSTEM

CROSS REFERENCE TO RELATED APPLICATIONS

This application claims the benefit of U.S. Provisional Application No. 62/939,677 filed Nov. 24, 2019 and U.S. Provisional Application No. 62/967,404 filed Jan. 29, 2020 the entirety of each of these applications is hereby incorporated by reference.

TECHNICAL FIELD

This disclosure relates to current sensors and, in particular, to open and closed loop current measurements.

BACKGROUND

Accurate and reliable electric current sensing may be important where processes, products and machines are electrically driven. Electrical vehicles, smart grid, smart factories, residential houses, renewable energy generation, and robotics are a few of the areas that can directly benefit from access to current consumption data. In an electric vehicle, current consumption data may be important for early fault diagnosis, vehicular health condition monitoring, and accurate range estimation. In smart grids current data may be used to manage distributed energy storages/power generators, isolate faults, and increase the safety and reliability. Smart factories use current data to monitor the operating statuses of their machines, control the production lines, and to increase productivity and efficiency. Residential houses can use current data to monitor their appliance activity, change habits to save electricity and for early fault diagnosis.

Current sensing technologies available today can be categorized into two sections, namely invasive and non-invasive technologies. In invasive technologies, the wire may be cut, and the sensor may be installed alone current flowing path. The current may be measured by the voltage drop across the sensor terminals. While invasive sensor technologies can be accurate, cutting the wire can lead to serious safety concerns, especially in systems that deliver high power. Also, the power lost across these invasive sensors can dampen the energy efficiency of the entire system.

Measuring the current at the high voltage conductors can be tricky with invasive current sensors because they can expose high voltage surfaces. The solution to this problem may be to employ non-invasive current sensors that can be clamped around a current carrying shielded conductor without exposing the conductor. These non-invasive (also referred to as non-intrusive) sensors operate on the principles of Ampere's law, that gives the magnetic field strength around a current carrying conductor. Hall-effect sensors are one of the popular current sensors available in the market today that offer non-invasive current sensing. Hall-effect sensors are non-contact sensors that utilize the hall effect property of metals to measure the magnetic field generated around a current carrying wire. Hall-Effect sensors that are designed to measure high currents are non-invasive but shows poor accuracy which dissuade their use in noise sensitive applications. On the other hand, hall-effect sensors designed to measure smaller currents (<10 A) accurately are shielded and invasive.

Another non-invasive technology for current measurement may be the flux-gate current sensor. This sensor can measure down to low currents (~50 mA) with a good dynamic range. However, flux-gate current sensors can be costly and bulky due to their complex magnetics and can have high self-heating due to large quiescent currents. And hence it may be clear that there is a need for high accuracy non-invasive current sensors in today's market.

BRIEF DESCRIPTION OF THE DRAWINGS

The embodiments may be better understood with reference to the following drawings and description. The components in the figures are not necessarily to scale. Moreover, in the figures, like-referenced numerals designate corresponding parts throughout the different views.

DETAILED DESCRIPTION

This disclosure presents a non-invasive, high accuracy current sensor with Magnetic Tunneling Junctions as the sensing element. A Magnetic Tunneling Junction (MTJ) may be a Magneto-Resistive (MR) device that can be used to measure external magnetic field vectors, and hence the current responsible for generating that magnetic field. An MTJ comprises a thin insulator sandwiched between two ferromagnets. The direction of the two magnetizations of the ferromagnetic films can be changed by an external magnetic field. As the relative orientation of the ferromagnetic layers change the effective resistance across the device would also change. Hence with proper noise and bias cancellation technologies, an MTJ can be an ideal candidate for non-invasive current sensing.

The current sensor may include at least two MR devices configured for differential sensing to negate magnetic field interferences generated by external sources. The outputs of the MR devices are passed through an analog frontend circuitry that filters out any noise and/or biasing present in the signal. This filtered signal may be then sampled by a digital signal processor and further processed and filtered in the digital domain. This resulting signal may be then used to back calculate the current that may be responsible generating the magnetic field measured by the MR devices. Finally, the calculated current may be then transmitted over a preferred communication channel to a remote computing unit.

Figure 1:
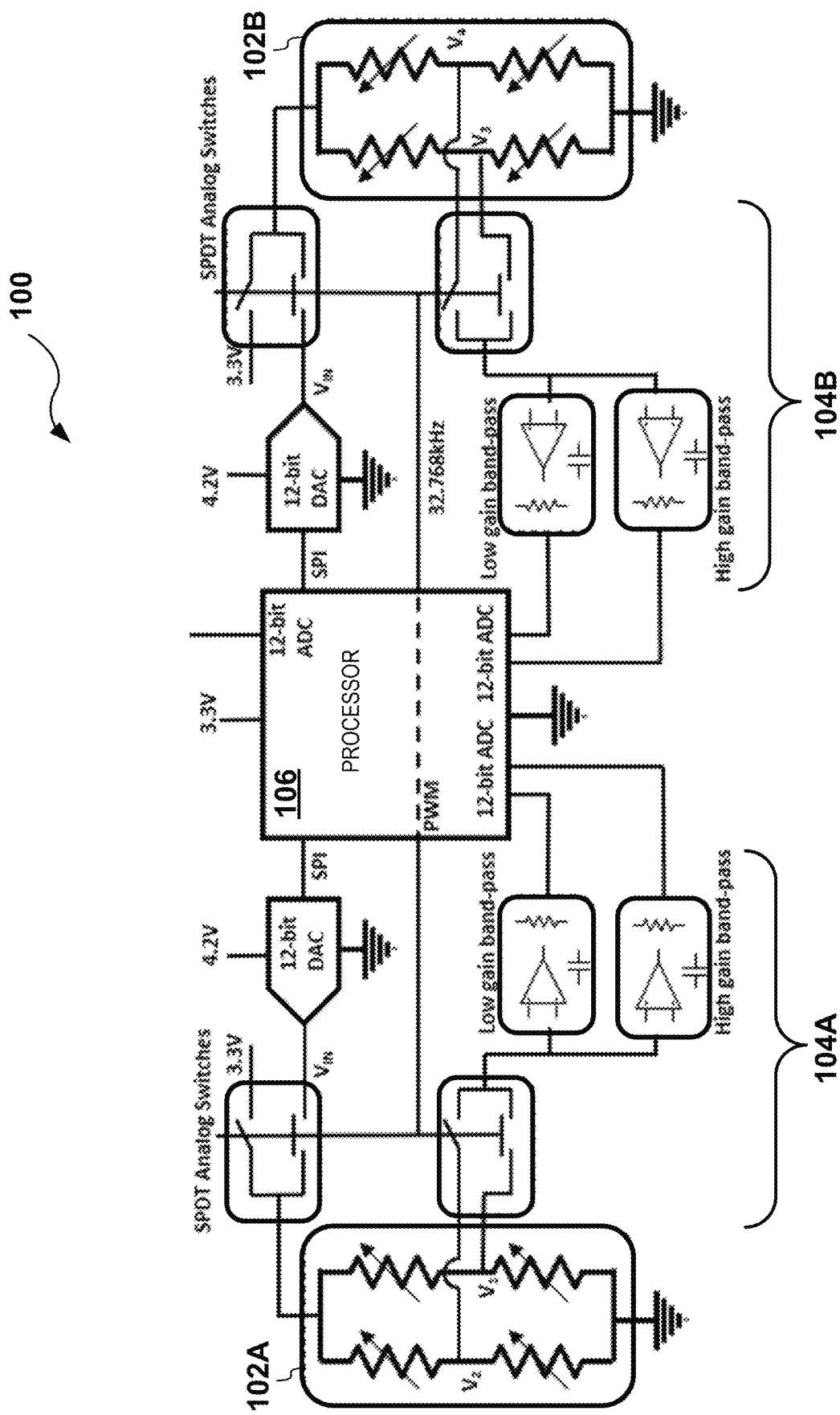
FIG. 1 Illustrates an example a non-invasive current sensor system in open loop configuration.

FIG. 1 Illustrates an example a non-invasive current sensor system 100. The system described in reference to FIG. 1 in open loop configuration. The system may include at least two magnetic field sensors 102A-B. (two are shown in FIG. 1). The magnetic field sensors 102A-B may provide differential sensing of the magnetic field generated around a current carrying conductor. The magnetic field sensors may include in some examples, magnetoresistance (MR) sensors. By way of example, the magnetic field sensors may include a tunnel-magnetoresistance sensor such as a SOP8 package of TMR2905 sensor from Multidimension Technology Co., Ltd. In application, other types of MR sensors may be suitable.

The system 100 may include analog frontend circuitry 104A-B and a processor 106. The analog frontend circuitry 104A-B may electrically couple the MR sensors 102 to the microprocessor 106. Each of the MR sensors 104A-B may have a separate corresponding set of frontend circuitry that connects with the processor 106. The frontend circuitry 104A-B may remove the DC offset generated by the MF sensors and filter undesirable frequency components.

Figure 2:
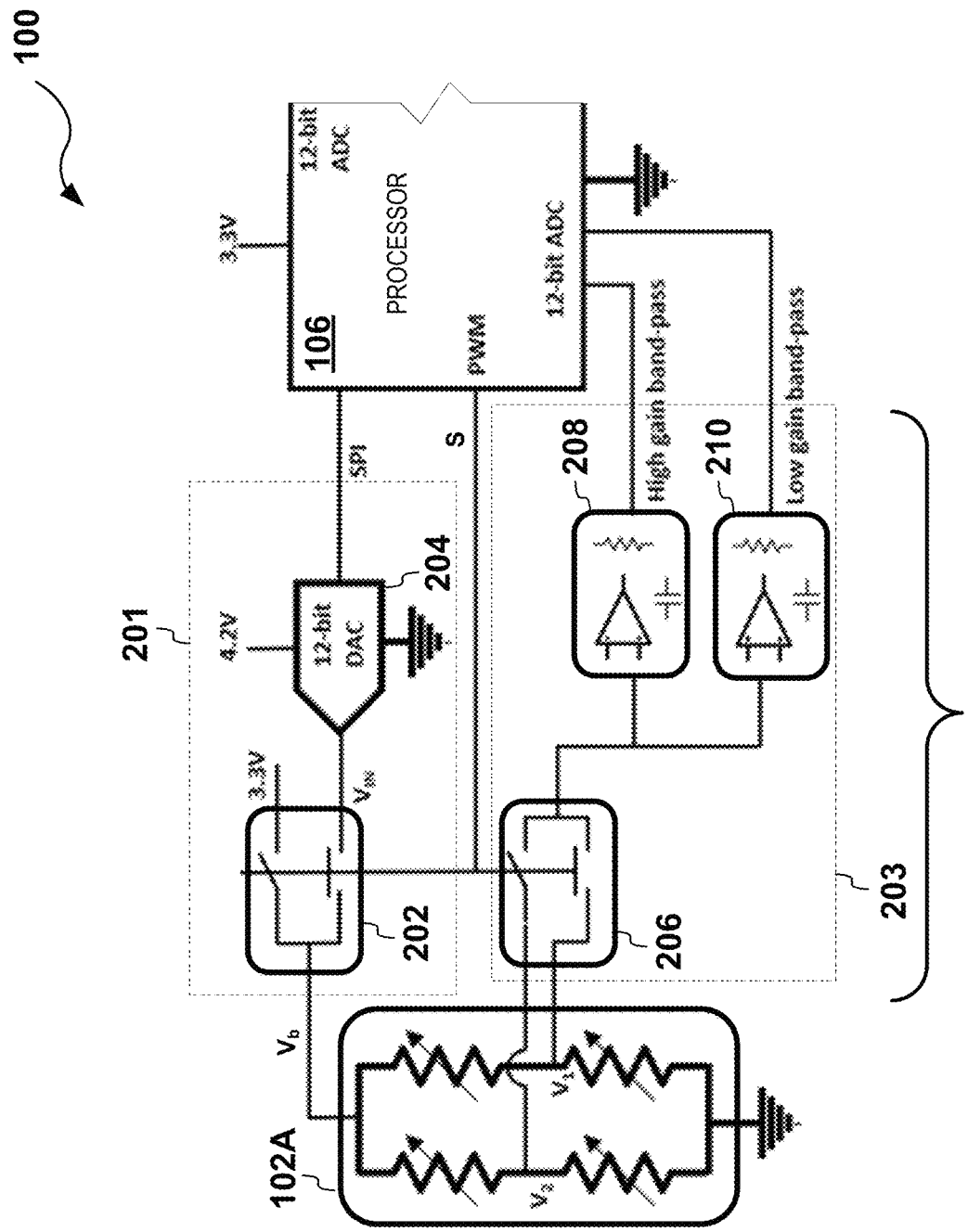
FIG. 2 illustrates an example of frontend circuitry and a processor for a magnetic field sensor.

FIG. 2 illustrates an example of frontend circuitry 104A and a processor 106 for the magnetic field sensor 102A. It should be appreciated that only a portion of the system 100 is illustrated in FIG. 2, and the system 100 may include multiple magnetic field sensors and separate supporting frontend circuitry. The frontend circuitry for other magnetic field sensors, such as the magnetic field sensor 102B in FIG. 1, may have the same or similar to components as the frontend circuitry 104A for the magnetic field sensor 102A illustrated in FIG. 2.

To remove the MR output offset from the magnetic field sensor 102A, the frontend circuitry may include biasing circuitry 201. The biasing circuitry 201 may provide a bias voltage $V_b$ to the MR Sensor 102A. The processor may cause the bias voltage $V_b$ to be varied to reduce or eliminate DC offset. In some examples, a switching technique may be applied to provide the bias voltage $V_b$. For example, the biasing circuitry 201 may include bias switching circuitry 202 and/or a digital to analog converter 204. The power to the magnetic field sensor may be alternated between a fixed voltage and a variable voltage ($V_{IN}$) based on a sampling signal provided by the processor 106. The bias switching circuitry 202 may include, for example, a Single Pole Double Throw (SPDT) switch that receives a fixed voltage and a variable voltage. The variable voltage may be driven by a digital to analog converter DAC 206, controlled by the processor in a feedback configuration (see FIG. 3 for example logic).

The frontend circuitry 104A may further include output conditioning circuitry 203. The output conditioning circuitry may upconvert signals from the sensor 104A and remove undesirable frequency components.

For example, output conditioning circuitry 203 may include sensor output switching circuitry 206 and/or bandpass filters 208-210. The sensor output switching circuitry 206 may include a SPDT switch, or some other suitable switch that permits selectively switching between differential outputs of the sensor 104A. For example, the output switching circuitry 206 may receive the two differential outputs (v1 and v2) from the magnetic field sensor 102A. In addition, the switching circuitry may receive a sampling signal S provided by the processor 106. The output switching circuitry 206 may select one of the outputs (v1 or v2) depending on the sampling signal S provided by the processor. The output from the output switching circuitry 206 (i.e. the selection of v1 or v2 from the magnetic field sensor 104A) may be connected to one or more bandpass filters 208-210.

The bias switching circuitry 202 and output switching circuitry 206 may be commonly controlled via the switching signal S. The sampling signal S may be generated by the processor. A signal line may connect the processor to both the output switching circuitry 206 and the bias switching circuitry 202. The sampling signal S may include, for example, a square wave signal at 32.768 kHZ or other suitable frequency. The sampling signal may be provided to separate frontend circuitry for each MF sensor of the system (such as the MF sensors 102A-B illustrated in FIG. 1).

The selected output from the output switching circuitry 206 may be provided to the one or more bandpass filters 208-210. Due to the switching action of the output offset removal process, the input to the bandpass filters may be a square wave (i.e. 32.768 kHz) of amplitude $\Delta V=|V_2-V_1|$. However, this amplitude $\Delta V$ can be controlled by changing output voltage $V_{IN}$ of the DAC 206. A plurality of feedback bandpass filters with high-Q factor may minimize the flicker noise from the opamp while rejecting the undesirable frequency components. For example, as illustrated in FIG. 2, the bandpass filters 208-210 may include a high gain bandpass filter 208 and a low gain bandpass filter 210. In this example embodiment, the gain of the high gain bandpass filter 208 may be set to ~450, or other suitable amplification. To measure larger currents without saturation, the low-gain bandpass filter 210 may have substantially the same frequency response but lower gain (~20). The high gain bandpass filter 208 may be connected parallel to the low gain bandpass filter 210 between the output of the sensor output switching circuitry 206 and the processor 106.

The output sinewaves from the bandpass filters may be sampled by inbuilt ADCs present in the processor. In various experiments, a 12 bit ADC with a sampling frequency of 2.8 MHz was used to generate experimental results (see FIGS. 6 and 7A-B). However, other bits and sampling frequencies are possible, depending in the processor, components, and design considerations for a given application.

The switching topology used in the design provides several advantages. First, output switching circuitry 206 up converts the sensor output from DC to the switching frequency. This allows the use of analog and digital filtering techniques, such as the bandpass filters 206-208, to reduce the noise content in the signal. Second, the dc offset inherent in the differential MR devices is removed or substantially minimized via the biasing circuitry 201.

Figure 3:
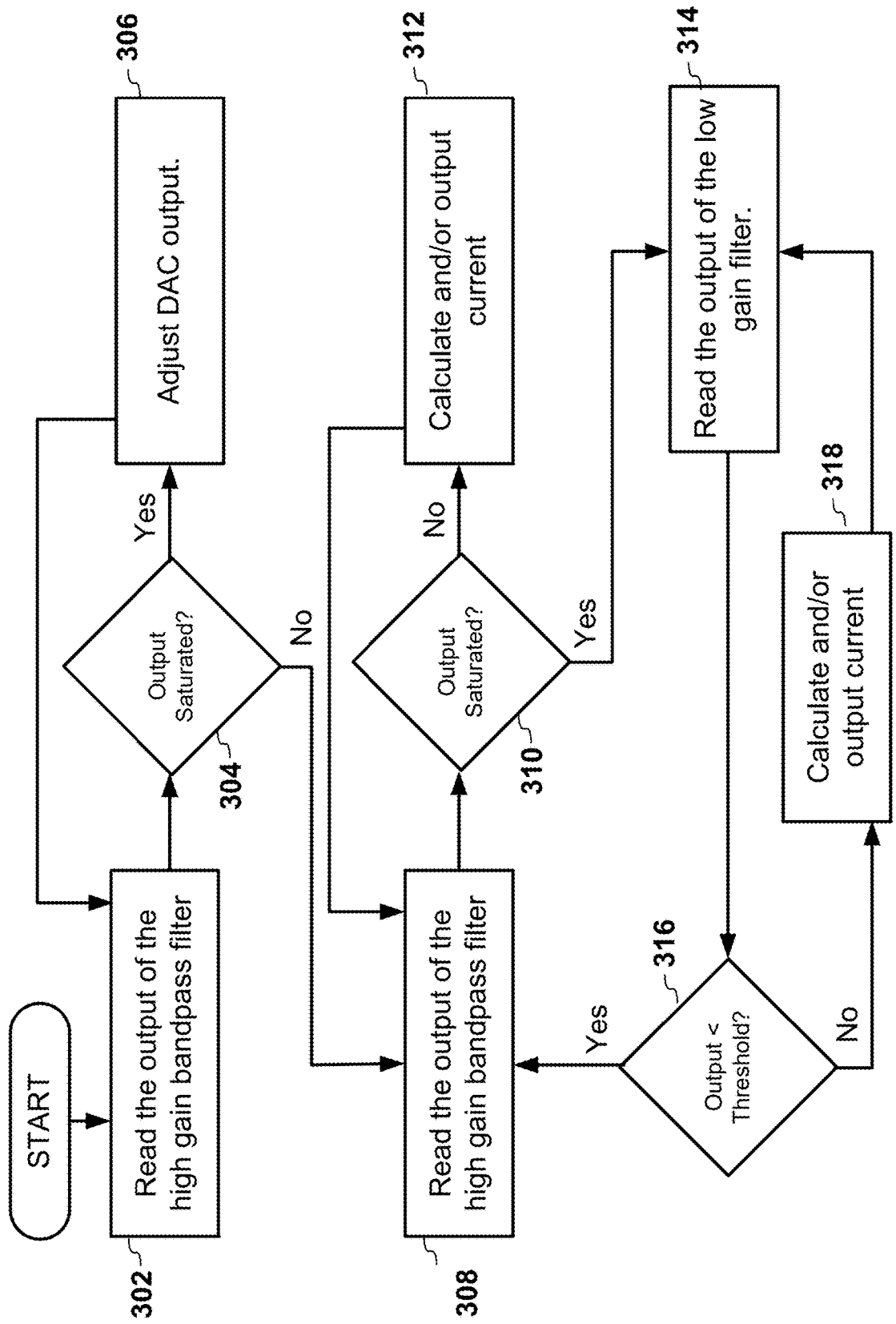
FIG. 3 illustrates a flow diagram for example logic for the system.

FIG. 3 illustrates a flow diagram of example logic for the system 100. Reference to FIGS. 1-2 is made throughout the following discussion of FIG. 3. If the offset present in the MR devices are too large, then the input to the filters will have a larger amplitude $\Delta V$, saturating the output of the high gain bandpass filter 208. Thus, the system may perform calibration (302-306) prior to current calculation. To perform the calibration, the processor 106 may read the output of the high gain bandpass filter 208 (302). For example, the output of the high gain bandpass filter 208 may be communicated to the analog to digital converter (ADC) of the processor. The processor may determine whether the output of the high gain bandpass filter 208 is saturated. (304). If the output of the high gain bandpass filter is saturated (304, yes), the processor may cause the DAC 206 to adjust the input voltage $V_{IN}$ to the bias switching circuitry 202 (306). For example, the processor may cause the DAC 206 to lower the input voltage $V_{IN}$ so that the amplitude $\Delta V$ is small enough not to saturate the high gain bandpass filter 208. Once this initial calibration is done, any change in the outputs of the bandpass filters 208-210 will substantially be attributable to the magnetic field generated by the current carrying wire. This initial calibration would ensure that any DC offset in the measurements due to external fields at the installation site is substantially removed.

In response to the output of the high gain bandpass filter 208 no longer being saturated (304, No), initial calibration is complete. After calibration, the processor 206 may selectively choose which bandpass filter to receive output for current calculation. The processor 106 may read the output of the high gain bandpass filter 108 (308). The processor 106 may determine whether the output is saturated (310). In response to the output not being saturated (310, No) the processor 106 may calculate and/or the current (312). The output current may be communicated to another device and/or stored in a memory. If the output of the high gain bandpass filter 208 is saturated (310, yes) due to the magnetic-field generated by the current, the low gain bandpass filter 210 may ensure accurate current readings are captured. Therefore, the processor 106 may read the output of the low gain bandpass filter 210 (314).

The processor may determine whether the output of the low gain bandpass filter 210 is less than a threshold value (316). If the output is greater than the threshold value (316, yes), the processor may calculate and/or output the current based on the output of the low gain bandpass filter (318). If the output is less than a threshold value (316, yes), the processor 106 may revert to calculating current based on the output from the high gain bandpass filter 208 as previously described in operations 308, 310, and 312.

To calculate the current, the two sampled waveforms from the sensors 102(A-B) are first subtracted to get differential reading, thereby rejecting any common-mode noise as explained in the previous sections. The resulting sinewave may be cross correlated with an internally generated sine and cosine waves of identical frequency. The equations governing the cross correlation referred to as optimal detection are shown in Equations 1-3.

$$a_1 = \sum_1^N x[n]\sin\left(2\pi\frac{f_0}{f_s}n\right) \quad \text{(Equation 1)}$$

$$b_1 = \sum_1^N x[n]\cos\left(2\pi\frac{f_0}{f_s}n\right) \quad \text{(Equation 2)}$$

$$OD_1 = \sqrt{a_1^2 + b_1^2} \quad \text{(Equation 3)}$$

where $f_0$ is the sine-wave frequency (In this example embodiment 32.768 kHz), and $f_s$ is the sampling frequency, N is the total number of samples in a computation. The optimal detector output $OD_1$ varies linearly with the differential magnetic field sensed from the two MR devices and can be used to determine the current flowing through the wire. In this example embodiment it was observed that at least 10 cycles of 32.768 kHz for the optimal detection calculation provides a significantly low noise content in the calculated amplitude.

To determine the direction of the current flow one must calculate the phase angle between the sampled differential waveform and the internal reference sine-waveform. The phase angle $\emptyset_1$ is given by Equation 4.

$$\emptyset_1 = \tan^{-1}\left(\frac{a_1}{b_1}\right) \quad \text{(Equation 4)}$$

where $a_1$ and $b_1$ are parameters calculated previously.

This calculated phase $\emptyset_1$ can be used to determine the direction of current flow by comparing it with a predefined reference phase. This technique to determine the current flowing direction is possible because the square wave form signal driving the SPDT switches are generated from the same processor that executes these equations. Hence, it can be determined that any phase change measured in the sampled waveform is due to a change in the direction of current flow, and not because of any mis match between two frequency sources.

Figure 4C:
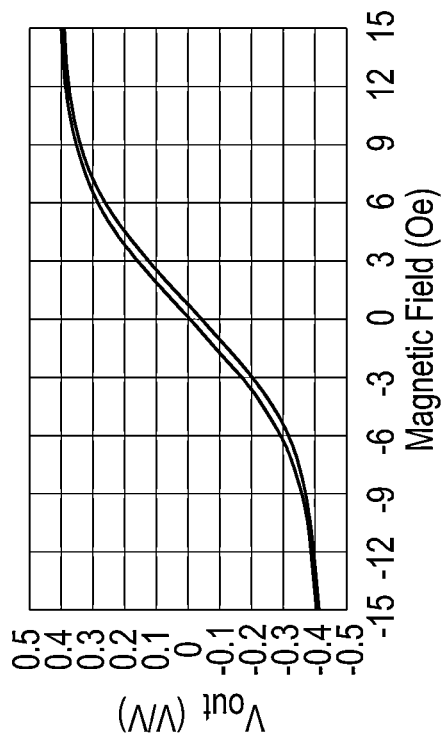
FIG. 4C illustrates an example of a response of a magnetic field sensor applied to a magnetic field.
Figure 4B:
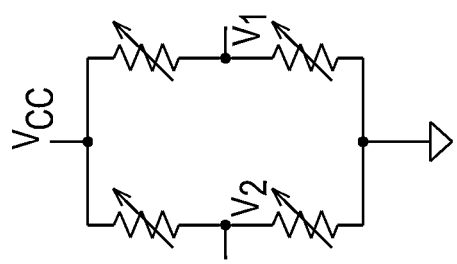
FIG. 4B illustrates a simplified schematic representation of internal magnetic tunnel junction (MTJ) elements which act as magnetic-field dependent variable resistors.
Figure 4A:
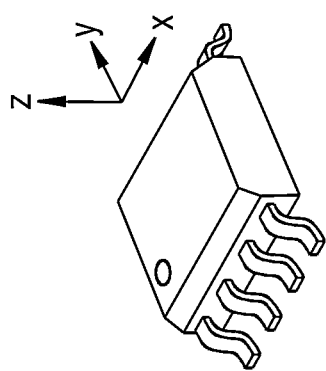
FIG. 4A illustrates an example of a magnetic field sensor.

FIG. 4A-C illustrate an example of a magnetic field sensor and a response of the magnetic field sensor. FIG. 4A illustrates an example of a magnetic field sensor sensor. The magnetic field sensor illustrated in FIG. 4A is a SOP8 package of TMR2905 sensor from Multidimension Technology Co., Ltd. In application, other types of MR sensors would be suitable. FIG. 4B illustrates a simplified schematic representation of internal magnetic tunnel junction (MTJ) elements which act as magnetic-field dependent variable resistors. FIG. 4C illustrates an example of a response of an magnetic field sensor applied to a magnetic field. The particular response illustrated in FIG. 4C is of a TMR905 to an applied magnetic field when the sensor is biased at 1V. Other responses may relevant in different examples, depending on the components used.

In various embodiments, the magnetic field sensors described herein may include a plurality of (i.e. four) unshielded MTJs in a push-pull Wheatstone bridge configuration as shown in FIG. 4B. The magnetic field sensor generates a linear differential-output voltage proportional to the magnetic field along the surface of the sensor package parallel to the y-axis shown in FIG. 4A. The response of an magnetic field sensor (TMR2905) when an external magnetic field up to +−50 Oe is applied, with the device biased at 1V is depicted in FIG. 4C.

Figure 5:
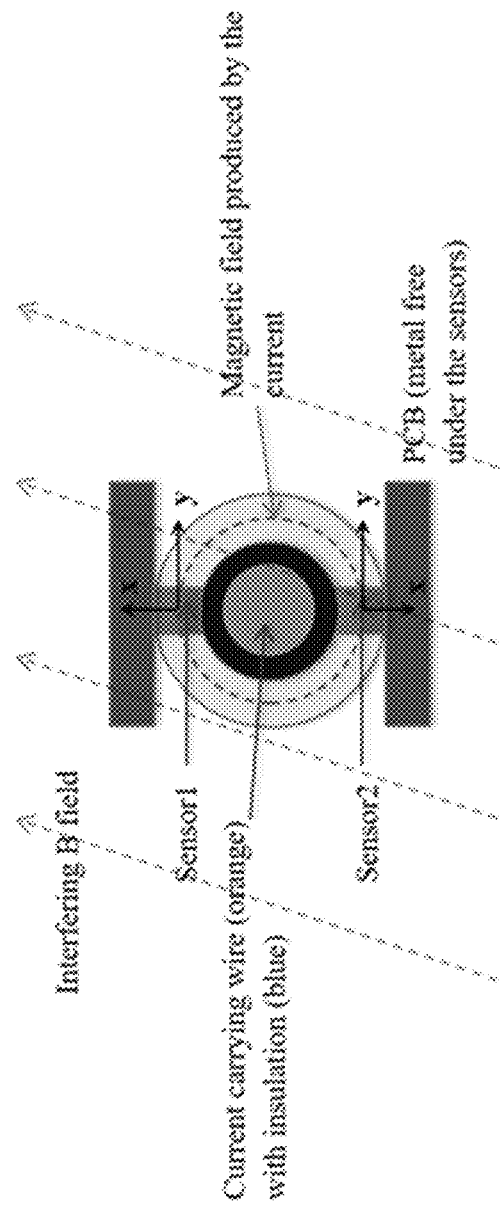
FIG. 5 Illustrates an example of magnetic field sensor placement for differential sensing and common-mode noise cancellation.

FIG. 5 Illustrates an example of magnetic field sensor placement for differential sensing and common-mode noise cancellation. To cancel any common mode noise and interfering magnetic fields generated by external sources, two MR devices may be used in differential configuration. Two magnetic field sensors may be positioned opposite each other (i.e. approx. 180 degrees) around the circular current carrying conductor with their y-axis pointing in the same direction. This will ensure that differential sensing will eliminate any common mode noise from interfering external fields. The two sensors may also be mounted on a substrate (e.g.: a metal-free clamp) to ensure that they maintain their relative positions with the current carrying conductor.

Assuming the magnetic field produced by the current carrying wire at the locations of the MR device is $B_{IN}$, and the total external fields at the same locations are $B_{ext}$, then the total magnetic field measured by each sensor can be written as described in equations 4 and 5.

$$S_{1,input} = B_{IN} + B_{ext} \quad \text{(Equation 5)}$$

$$S_{2,input} = -B_{IN} + B_{ext} \quad \text{(Equation 6)}$$

If sensitivities of the two magnetic field sensors combined with the gains of the analog frontend are denoted by $C_1$ and $C_2$, the two outputs at the analog frontend with the applied magnetic field can be written as described in equations 7 and 8.

$$S_{1,output} = (B_{IN} + B_{ext})C_1 \quad \text{(Equation 7)}$$

$$S_{2,output} = (-B_{IN} + B_{ext})C_2 \quad \text{(Equation 8)}$$

In some examples, the system may be symmetrical with identical $C_1$ & $C_2$ values, and the differential output can be calculated as described in Equation 9

$$\Delta S_- = S_{1,output} - S_{2,output} = 2CB_{IN} = 2C\left(\frac{\mu_0 I_{IN}}{2\pi r}\right), \quad \text{(Equation 9)}$$

where $C_1 = C_2 = C$

Hence, the differential measurement rejects common mode noise, and stray fields (including earth's magnetic field).

To increase the sensitivity of the current sensor, a high gain amplifier may read the outputs of the sensors. However, due to process variations during manufacturing, the differential output voltage of the sensors are not always zero as expected, as the resistances along the two branches can deviate slightly. Hence this output offset may be removed before a high gain amplifier can be applied at the output of the sensors to keep the amplifiers from saturating.

Figure 6:
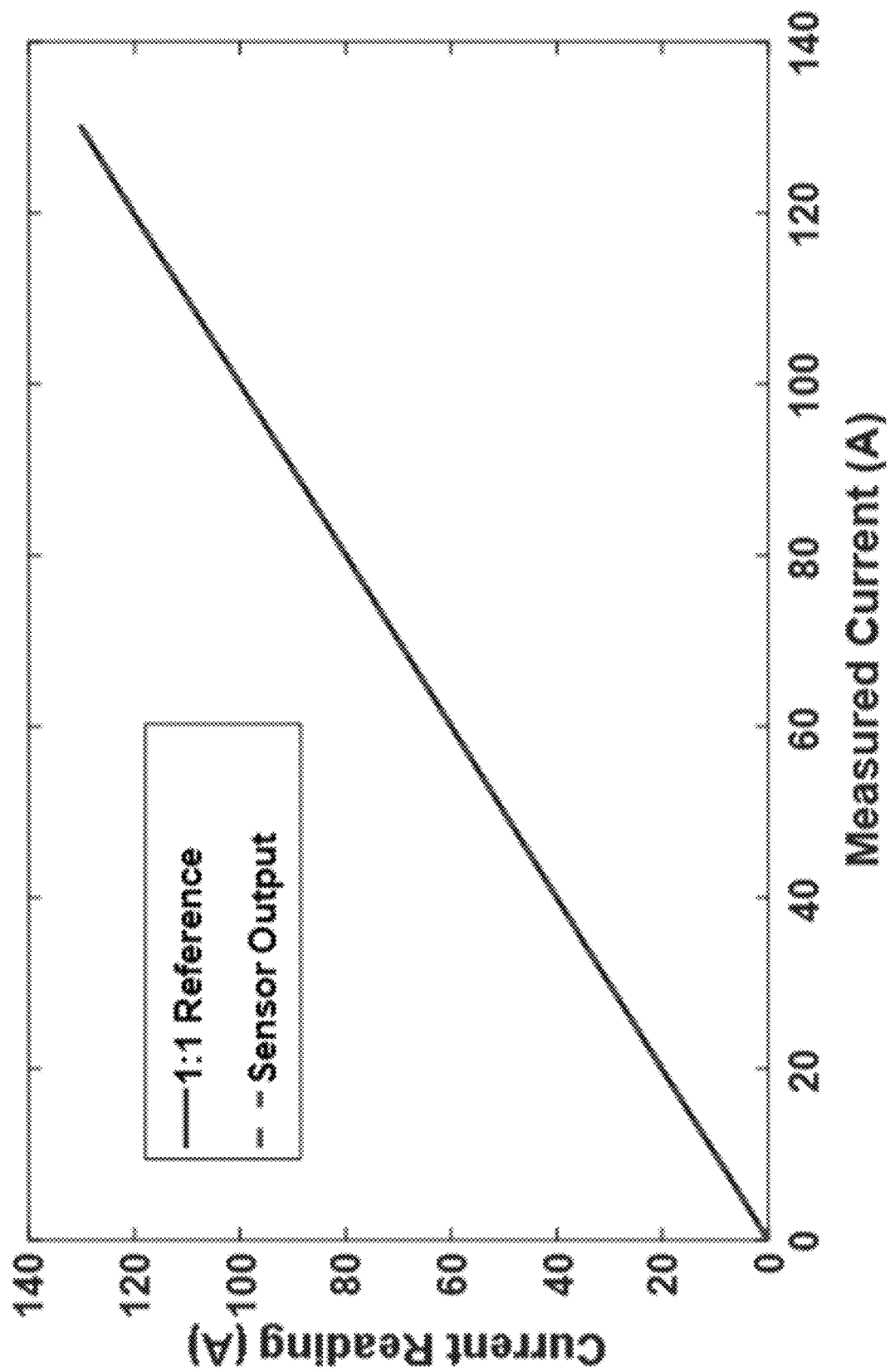
FIG. 6 Illustrates an example of the calibrated sensor output variation with the current through the conductor.
Figure 7B:
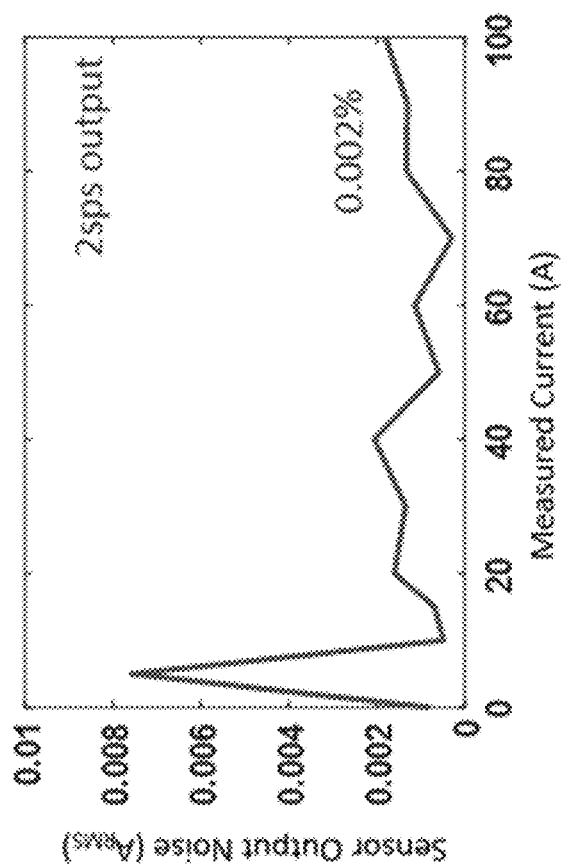
FIG. 7B illustrates a noise content in the sensor output in an example embodiment for different measured currents at 2 samples per second sampling rate.
Figure 7A:
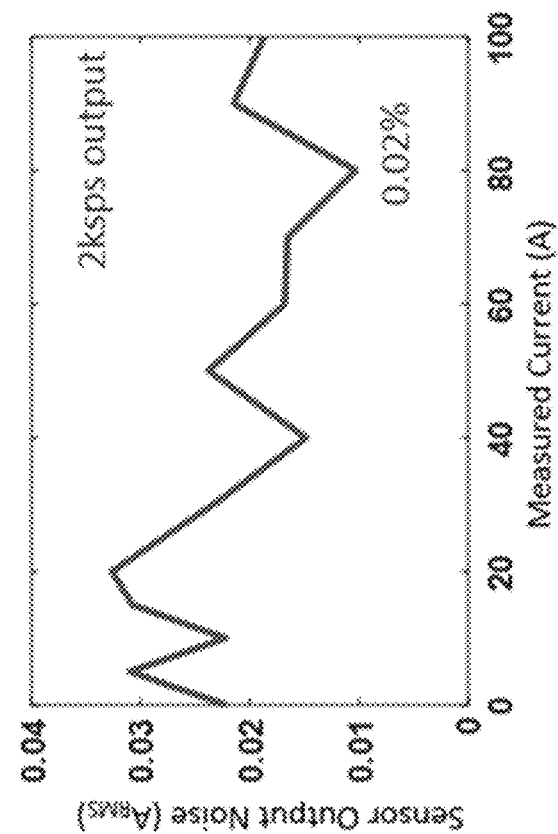
FIG. 7A illustrates a noise content in the sensor output in an example embodiment for different measured currents at 2 k samples per second sampling rate.

FIG. 6 Illustrates an example of the calibrated sensor output variation with the current through the conductor. The performance of the system was tested for measuring current through a wire up to 140 A and the results from various experiments are illustrated in FIG. 6. FIG. 7A-B illustrate noise content in sensor output according to various experimentation. FIG. 7A illustrates noise content (~0.02%) in the sensor output in this example embodiment for different measured currents at 2 k samples per second sampling rate. FIG. 7B illustrates the noise content (~0.002%) in the sensor output for different measured currents at 2 samples per second sampling rate. These measurements are provided from various experimentation and other results are possible depending on the components and design specifications of a particular application.

Figure 8:
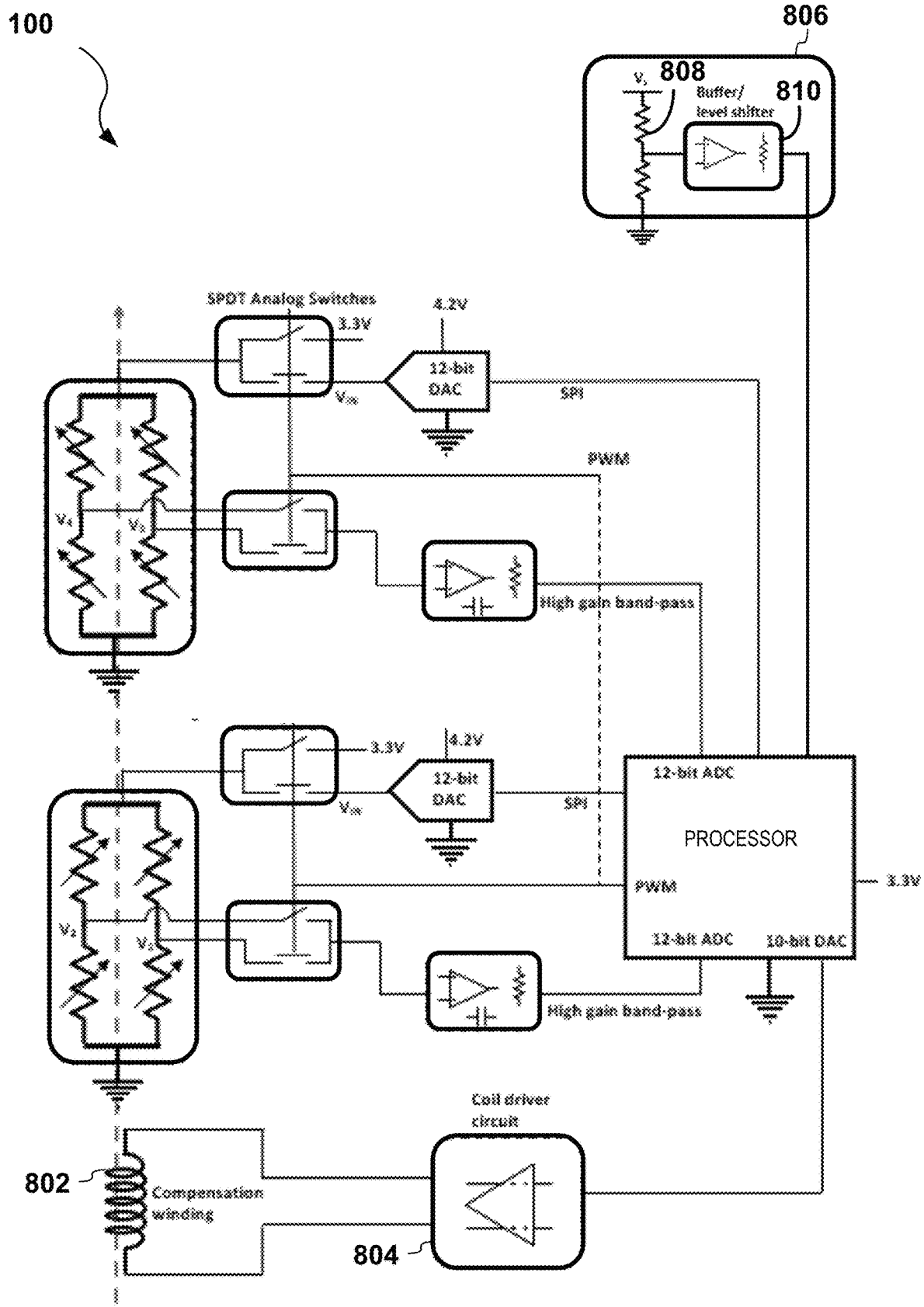
FIG. 8 illustrates an example of the non-invasive current sensor system in closed loop configuration.

FIG. 8 illustrates an example of the non-invasive current sensor system in closed loop configuration. The operating range of the system can be increased by including a compensation winding 802 in the system. The system may further include a coil driver circuitry 804. In this configuration, the processor 106 will control the current through the compensation winding 802 in a closed loop configuration to reduce the magnetic field applied on the magnetic field sensors by the current carrying conductor.

Due to the low total magnetic field across the magnetic field sensors, hysteresis effects will have minimal impact on the operation. The current through the external wire is directly proportional to the current through the compensation winding when the effective magnetic field acting on the magnetic field sensors are zero.

In examples where the current been measured is alternating current (ac), then the optimal detector output $OD_1$ may also a sinusoidal shape. To measure ac currents of a particular frequency we apply optimal detection to the output of the first optimal detector, as shown in equations 10-12.

$$a_2 = \sum_1^N OD_1[n]\sin\left(2\pi \frac{f_{ac}}{f_{OD}} n\right) \quad \text{(Equation 10)}$$

$$b_2 = \sum_1^N OD_1[n]\cos\left(2\pi \frac{f_{ac}}{f_{OD}} n\right) \quad \text{(Equation 11)}$$

$$OD_2 = \sqrt{a_2^2 + b_2^2} \quad \text{(Equation 12)}$$

where $f_{OD}$ is the $OD_1$ sample frequency (number of $OD_1$ calculations per second) and $f_{ac}$ is the frequency of the internal reference sine and cosine waveforms and N is the number of samples used for optimal detection. To measure the gird current in USA, $f_{ac}$ would be set to 60 Hz. The output $OD_2$ varies linearly with the measured ac current RMS (or amplitude) and can be used to calculate the ac current flowing through the wire.

To have an accurate estimate of the ac current amplitude flowing through the wire it is important to have $f_{OD} > 10 f_{ac}$. Due to the high sampling rate and optimized calculations, the processor may also calculate the third ($f_{ac} = 180$ Hz) and fifth current ($f_{ac} = 300$ Hz) harmonics accurately.

To calculate power, the system may be equipped with voltage measurement circuitry 806 to measure the supply voltage $V_s$. The voltage measurement circuitry 806 may include with a resistor divider 808 to measure high voltages and a buffer/level shifter 810 to measure ac or negative voltages. The voltage signal may be sampled at each $OD_1$ calculation. For ac voltages optimal detection may be applied on the sampled voltage waveform to obtain the RMS voltage or amplitude while rejecting undesired frequency components, as described in Equations 13-15.

$$a_v = \sum_1^N V_s[n]\sin\left(2\pi \frac{f_{ac}}{f_{OD}} n\right) \quad \text{(Equation 13)}$$

$$b_v = \sum_1^N V_s[n]\cos\left(2\pi \frac{f_{ac}}{f_{OD}} n\right) \quad \text{(Equation 14)}$$

$$OD_v = \sqrt{a_v^2 + b_v^2} \quad \text{(Equation 15)}$$

where $V_s$ is the sampled voltage, $f_{OD}$ is the $OD_1$ sample frequency (no of $OD_1$ calculations per second) and $f_{ac}$ is the frequency of the internal reference sine and cosine waveforms and N is the number of samples used for optimal detection. The output $OD_v$ varies linearly with the measured ac voltage RMS (or amplitude) and can be used to calculate the supply voltage.

In ac devices, the power consumption can have imaginary components based on their inner construction. To calculate imaginary components of power, it the processor may calculate the phase difference between the measured current and the measured voltage. The processor may calculate the phase different as described in equations 16-18.

$$\emptyset_v = \tan^{-1}\left(\frac{a_v}{b_v}\right) \quad \text{(Equation 16)}$$

$$\emptyset_2 = \tan^{-1}\left(\frac{a_2}{b_2}\right) \quad \text{(Equation 17)}$$

$$\text{phase diff} = \emptyset_2 - \emptyset_v \quad \text{(Equation 18)}$$

Here $\emptyset_v$ gives the phase of the measured ac voltage w.r.t the internal reference sine-wave, $\emptyset_2$ gives the phase of the measured ac current w.r.t the internal reference sine-wave, and their difference gives the phase difference.

Certain machines or processes (ex: welding machine) are known to operate intermittently with distinctive no-load conditions or other characteristic behaviors with pre-determined current consumption patterns. In such scenarios, the current processor may detect such intermittent behaviors and use the pre-determined current consumption patterns to re-calibrate the system, removing any dc offset present in the output.

The processor and/or system may support several communication protocols to connect with external computing resources, including but not limited to WIFI, Bluetooth, USB, I2C, SPI and powerline communication.

The system may be implemented with additional, different, or fewer components than illustrated. Each component may include additional, different, or fewer components.

In various embodiments, the system may provide calculate harmonic current and/or voltage content by re-applying optimal detection to the current and/or voltage values calculated using new reference sine and cosine-waves with frequencies that are integer multiples of the ac current/voltage frequency.

In various embodiments, the system may perform temperature data collection and apply temperature compensation on the calculated current. Alternatively or in addition, the system may apply hysteresis correction on the calculated current based on known hysteresis behavior of MR sensors using a lookup table and the history of the measured current.

The system described herein may be accompany various electric machines, such as welding machines, manufacturing robots, drilling machines, and the machine utilizes the measured current for checking machine status, process status, and/or product status.

Examples of the processor may include a general processor, a microcontroller (a central processing unit, an embedded processor, an application specific integrated circuit (ASIC), a digital signal processor, a field programmable gate array (FPGA), and/or a digital circuit, analog circuit, or some combination thereof. Alternatively or in addition, the processor may be one or more devices operable to execute logic. The logic may include computer executable instructions or computer code stored in the memory or in other memory that when executed by the processor cause the processor to perform the operations described herein. The computer code may include instructions executable with the processor.

The system may be implemented in many ways. In some examples, the system may be implemented with one or more logical components. For example, the logical components of the system may be hardware or a combination of hardware and software. The logical components may any component or subcomponent of the system 100. In some examples, each logic component may include an application specific integrated circuit (ASIC), a Field Programmable Gate Array (FPGA), a digital logic circuit, an analog circuit, a combination of discrete circuits, gates, or any other type of hardware or combination thereof. Alternatively or in addition, each component may include memory hardware, such as a portion of the memory for example, that comprises instructions executable with the processor or other processor to implement one or more of the features of the logical components. When any one of the logical components includes the portion of the memory that comprises instructions executable with the processor, the component may or may not include the processor. In some examples, each logical component may just be the portion of the memory or other physical memory that comprises instructions executable with the processor, or other processor(s), to implement the features of the corresponding component without the component including any other hardware. Because each component includes at least some hardware even when the included hardware comprises software, each component may be interchangeably referred to as a hardware component.

All of the discussion, regardless of the particular implementation described, is illustrative in nature, rather than limiting. The respective logic, software or instructions for implementing the processes, methods and/or techniques discussed above may be provided on computer readable storage media. The functions, acts or tasks illustrated in the figures or described herein may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing and the like. In one example, the instructions are stored on a removable media device for reading by local or remote systems. In other examples, the logic or instructions are stored in a remote location for transfer through a computer network or over telephone lines. In yet other examples, the logic or instructions are stored within a given computer and/or central processing unit ("CPU").

Furthermore, although specific components are described above, methods, systems, and articles of manufacture described herein may include additional, fewer, or different components. For example, a processor may be implemented as a microprocessor, microcontroller, application specific integrated circuit (ASIC), discrete logic, or a combination of other type of circuits or logic. Similarly, memories may be DRAM, SRAM, Flash or any other type of memory. Flags, data, databases, tables, entities, and other data structures may be separately stored and managed, may be incorporated into a single memory or database, may be distributed, or may be logically and physically organized in many different ways. The components may operate independently or be part of a same apparatus executing a same program or different programs. The components may be resident on separate hardware, such as separate removable circuit boards, or share common hardware, such as a same memory and processor for implementing instructions from the memory. Programs may be parts of a single program, separate programs, or distributed across several memories and processors.

A second action may be said to be "in response to" a first action independent of whether the second action results directly or indirectly from the first action. The second action may occur at a substantially later time than the first action and still be in response to the first action. Similarly, the second action may be said to be in response to the first action even if intervening actions take place between the first action and the second action, and even if one or more of the intervening actions directly cause the second action to be performed. For example, a second action may be in response to a first action if the first action sets a flag and a third action later initiates the second action whenever the flag is set.

To clarify the use of and to hereby provide notice to the public, the phrases "at least one of <A>, <B>, . . . and <N>" or "at least one of <A>, <B>, . . . <N>, or combinations thereof" or "<A>, <B>, . . . and/or <N>" are defined by the Applicant in the broadest sense, superseding any other implied definitions hereinbefore or hereinafter unless expressly asserted by the Applicant to the contrary, to mean one or more elements selected from the group comprising A, B, . . . and N. In other words, the phrases mean any combination of one or more of the elements A, B, . . . or N including any one element alone or the one element in combination with one or more of the other elements which may also include, in combination, additional elements not listed.

While various embodiments have been described, it will be apparent to those of ordinary skill in the art that many more embodiments and implementations are possible. Accordingly, the embodiments described herein are examples, not the only possible embodiments and implementations.

What is claimed is:

1. A non-intrusive current monitoring system with open loop configuration, comprising:
   two magnetic field sensor configured for differential sensing of a magnetic field generated around a current carrying conductor;
   analog frontend circuitry configured to remove direct current (DC) offset of the magnetic field sensors, upconvert the outputs of the magnetic field sensors, and filter out at least one frequency component from the up-converted signals; and
   a processor configured to:
     receive output signals from the analog front-end circuitry corresponding to each magnetic field sensor,
     calculate a differential signal based on the output signals;
     apply optimal detection based on the differential signal and a reference signal to calculate a measurement of current flow in the conductor;
     determine a phase angle measurement between the differential signal and the reference signal to calculate a direction of the current flow in the conductor; and
     output data comprising the phase angle measurement and the measurement of current flow.

2. The non-intrusive current monitoring system of claim 1, wherein the magnetic field sensors comprise an Magneto-Resistive (MR) sensor, where the MR sensor comprises a group of Magnetic Tunnel Junctions (MTJs) configured in a Wheatstone bridge.

3. The non-intrusive current monitoring system of claim 1, wherein the analog frontend circuitry further comprises biasing circuitry, the biasing circuitry configured to:
   provide a bias voltage supplied to at least one of the magnetic field sensors and substantially cancel the DC offset.

4. The non-intrusive current monitoring system of claim 3, wherein the bias circuitry further comprises bias switch circuitry that receives a fixed voltage, a variable voltage, and a sampling signal, the bias switching circuitry configured to alternate, based on the sampling signal, between the fixed and variable voltages and output the bias voltage, wherein the processor is further configured to:
   adjust the variable voltage to vary the bias voltage provided to the magnetic field sensor.

5. The non-intrusive current monitoring system of claim 4, wherein biasing circuitry further comprises a digital to analog converter (DAC) configured to convert a digital control signal generated by the processor to the variable voltage provided to the bias switching circuitry.

6. The non-intrusive current monitoring system of claim 1, wherein at least one of the magnetic field sensor comprises differential outputs, wherein the analog frontend circuitry further comprises:
   output switching circuitry configured to up convert the differential outputs to a higher frequency and combine the differential outputs to a combined output.

7. The non-intrusive current monitoring system of claim 6, wherein the analog frontend circuitry further comprises:
   a plurality of bandpass filters configured with different gains, the bandpass filters each configured to receive the combined output from the output switching circuitry, the bandpass filters being configured to amplify the combined output while filtering the undesirable frequency components.

8. The system of claim 1 wherein the reference signal comprises a reference sine wave with a frequency that is an integer multiples of the ac current/voltage frequency.

9. A non-intrusive current monitoring system with closed loop configuration, comprising:
   two magnetic field sensors configured for differential sensing of a magnetic field generated around a current carrying conductor;
   analog frontend circuitry for each of the sensors, wherein the analog front end circuitry for each sensor is configured to remove direct current (DC) offset of a corresponding magnetic field sensor, upconvert the output of the corresponding magnetic field sensor, and filter out undesirable frequency components from the up-converted signal; and
   a processor configured to:
     measure a differential sensor output based on output signals received from the analog front-end circuitry;
     generate control signals to cause a coil winding on the current carrying conductor to cancel effective magnetic field acting on the magnetic field sensors;
     determine a measurement of the current flowing through the conductor based on the differential sensor output; and
     output data comprising the current flow measurement.

10. The non-intrusive current monitoring system of claim 9, wherein the each of the magnetic field sensors include a separate group of four magnetic tunnel junctions connected in a Wheatstone bridge configuration.

11. The non-intrusive current monitoring system of claim 9, wherein the analog frontend circuitry further comprises:
   a compensation winding configured to attach to the current carrying conductor;
   coil driver circuitry connected to the compensation winding, the coil driver circuitry configured to excite the compensation winding,
   wherein the processor is further configured to:
     cause the coil driver circuitry to excite the compensation winding to reduce the effective magnetic field acting on the MR sensors.

12. The non-intrusive current monitoring system of claim 9, wherein the analog frontend circuitry further comprises:
   sensor biasing circuitry including a digital to analog converter (DAC), wherein the processor is further configured to:
     caused the DAC to adjust a bias voltage applied to the magnetic field sensor to substantially cancel the DC offset in the output of the at least one of the magnetic field sensors.

13. The non-intrusive current monitoring system of claim 9, wherein the sensor biasing circuitry further includes a switch configured to provide the output bias voltage, wherein the switch is configured to switch between a fixed voltage and variable voltage based on the sampling signal, the variable voltage provided by the DAC.

14. The non-intrusive current monitoring system of claim 9, wherein the analog frontend circuitry further comprises:
sensor output switching circuitry configured to receive a sampling signal from the processor and up convert output of MR sensor to a higher frequency based on the sampling signal.

15. The non-intrusive current monitoring system of claim 9, to determine a measurement of the current flowing through the conductor, the processor is further configured to:
apply optimal detection based on the differential signal and a reference signal to calculate a measurement of current flow in the conductor; and
calculate the measurement of current based on the optimal detection.

16. A method for non-intrusive current monitoring, comprising:
performing calibration to remove, from the output of a magnetic field sensor proximate to a current carrying wire, a direct current (DC) offset caused by external magnetic field not generated by the current carrying wire;
causing output switching circuitry to switch between differential outputs of the magnetic field sensor and generate a combined output signal;
receiving a first filtered signal from a high-gain bandpass filter that receives the combined output signal;
receiving a second signal from a low-gain bandpass filter that receives the combined output signal;
selecting one of the first filtered signal or the second filtered signal to avoid saturation;
calculating the phase angle between the selected signal and an internal reference signal to determine the current flowing direction; and
outputting the phase angle.

17. The method of claim 16, further comprising
controlling current through a compensation winding attached to the current carrying wire to reduce the effective magnetic field across the MR sensor.

\* \* \* \* \*